United States Patent [19]

Ohkawa

[11] Patent Number: 5,053,706
[45] Date of Patent: Oct. 1, 1991

[54] COMPACT LOW-DISTORTION SQUID MAGNETOMETER

[75] Inventor: Norio Ohkawa, Amagasaki, Japan

[73] Assignee: Mitsubishi Denki Kabushiki Kaisha, Japan

[21] Appl. No.: 213,153

[22] Filed: Jun. 29, 1988

[30] Foreign Application Priority Data

Jul. 6, 1987 [JP] Japan .................. 62-167047

[51] Int. Cl.⁵ ............................................. G01R 33/35
[52] U.S. Cl. ..................................... 324/248; 505/846
[58] Field of Search ............... 524/248, 244, 260, 247; 505/842, 843, 845, 846, 862, 865, 873, 874

[56] References Cited

U.S. PATENT DOCUMENTS 3,506,913 4/1970 Lambe et al. ........................ 324/248
4,491,795 1/1985 Gelinas ................................ 324/248

FOREIGN PATENT DOCUMENTS 224677 7/1985 Fed. Rep. of Germany ...... 324/248
3529815 2/1987 Fed. Rep. of Germany ...... 324/248
1146820 3/1969 United Kingdom ............... 324/248

OTHER PUBLICATIONS

Clarke, "Advances in SQUID Magnetometers" *IEEE Transactions on Electron Devices*, vol. ED-27, No. 10, Oct. 1980, pp. 1896–1908.
Ehnholm et al., "Thin Film SQUID's for Magnetic Field Measurements", *Jap. Journal of Applied Physics*, vol. 16 (1977), Supp. 16-1, pp. 261–263.
Shirae et al., "A New Multi Element of SQUID System and to Application to the Magnetic Vector Gradiometer", *Cryogenics*, Dec. 1981, pp. 707–710.
Wynn et al., "Advanced Superconductivity Gradiometer/Magnetometer Arrays and a Novel Signal Processing Technique", *IEEE Trans. on Magnetics*, vol. May-11, No. 2, Mar. 1975, pp. 701–707.
Clarke et al., "The Impact of . . . SQUID Magnetometers", Science, vol. 242, Oct. 1988, pp. 217–223.
Wellstood et al., "Integrated dc SQUID Magnetometer with a High Slew Rate", Rev. Sci. Instrum. 55 (6), Jun. 1984, pp. 952–957.
Carelli et al., "Behavior of a Multiloop dc Superconducting Quantum Interference Device", J. Appl. Phys. 53 (1), Nov. 1982, pp. 7592–7598.
Takashi et al., "SQUID Magnetometers", UDC 538.7.08, vol. 41, Nos. 1-2, Jun. 1984, pp. 99–113.

Primary Examiner—Kenneth A. Wieder
Assistant Examiner—W. Edmonds
Attorney, Agent, or Firm—Leydig, Voit & Mayer

[57] ABSTRACT

A SQUIDs magnetometer has three planar SQUID's which are fabricated on substrates mounted on three nonparallel surfaces of a member. Each SQUID is connected to a flux-locked loop drive circuit, and each SQUID has a main coil which is formed on the respective substrate and is threaded by the flux of an external magentic field which is being measured.

5 Claims, 5 Drawing Sheets

COMPACT LOW-DISTORTION SQUID MAGNETOMETER

BACKGROUND OF THE INVENTION

This invention relates to a high-sensitivity and compact SQUID magnetometer.

There have been numerous disclosures of magnetometers which employ a superconducting quantum interference device (hereinafter abbreviated as SQUID). For example, a recent article in the Shimadzu Review (Vol. 41, June, 1984, pp. 99–113, in Japanese) disclosed a triaxial SQUID magnetometer for use in measuring undersea geomagnetic fields. As shown in FIG. 1, which is a schematic perspective view of that magnetometer, an x-axis superconducting shield 1, a y-axis superconducting shield 2, and a z-axis superconducting shield 3 respectively house an unillustrated x-axis SQUID, a y-axis SQUID, and a z-axis SQUID. The three SQUID's are respectively driven by an x-axis SQUID drive circuit 4, a y-axis SQUID drive circuit 5, and a z-axis SQUID drive circuit 6. An x-axis pickup coil 7, a y-axis pickup coil 8, and a z-axis pickup coil 9 are mounted on a bobbin 13. The three pickup coils 7-9 lie in three mutually orthogonal planes, the x-axis pickup coil 7 lying in a plane which is normal to the x-axis in FIG. 1, the y-axis pickup coil 8 lying in a plane which is normal to the y-axis, and the z-axis pickup coil 9 lying in a plane which is normal to the z-axis. The unillustrated x-axis SQUID which is housed within the x-axis superconducting shield 1 is electrically connected to the x-axis pickup coil 7 by superconducting twisted wires 10. Similarly, the y-axis SQUID and the z-axis SQUID are respectively connected to the y-axis pickup coil 8 and the z-axis pickup coil 9 by superconducting twisted wires 11 and 12, respectively.

FIG. 2 schematically illustrates the elements which are housed within the x-axis superconducting shield 1. A capacitor 14 is connected between the x-axis SQUID drive circuit 4 and ground, while an inductance 15 is connected in parallel with the capacitor 14. An rf current is passed through the inductance 15 by the drive circuit 4. The inner ends of the superconducting twisted wires 10 are connected to an x-axis input coil 17. The x-axis pickup coil 7, the superconducting twisted wire 10, and the x-axis input coil 17 form a single superconducting closed loop. An x-axis rf SQUID 16 is disposed inside the superconducting shield 1 and is magnetically coupled with the inductance 15 and the input coil 17. The SQUID 16 has a single Josephson tunnel junction 16a. The y-axis superconducting shield 2 and the z-axis superconducting shield 3 house similar components.

When the conventional magnetometer of FIGS. 1 and 2 is operated, the superconducting shields and the components housed therein are cooled to a cryogenic state in which they become superconducting. With reference to FIG. 2, quantization of flux takes place in the closed superconducting loop formed by the x-axis pickup coil 7, the twisted wires 10, and the input coil 17, and a flux which threads this closed loop is always maintained constant. Therefore, if the flux which threads the x-axis pickup coil 7 should vary with respect to its value when the closed loop became superconducting, a shielding current which acts to maintain the flux constant within the closed loop will flow through the closed loop, and a change in flux will be transmitted from the x-axis input coil 17 to the x-axis rf SQUID 16. The x-axis rf SQUID 16 is magnetically coupled with the inductance 15, so any change in the flux through the x-axis pickup coil 7 will produce a change in the output voltage Vout(x) of the x-axis SQUID drive circuit 4. Due to the Meissner effect, the x-axis superconducting shield 1 is completely diamagnetic when in a superconducting state, and external noise is prevented from reaching the x-axis rf SQUID 16.

The circuits for the y-axis SQUID and the z-axis SQUID operate in the same manner. By means of this apparatus, the components along the x, y, and z axes of a magnetic field can be detected.

In a conventional SQUID magnetometer of this structure, the external magnetic field is distorted in the vicinity of the superconducting shields 1-3. This distortion produces inaccuracies in the measured field strength. It is posible to reduce the influence of the distortion produced by the superconducting shields 1-3 by increasing the distance between the superconducting shields and the pickup coils 7-9, but this causes an undesirable increase in the size of the magnetometer.

SUMMARY OF THE INVENTION

Accordingly, it is an object of the present invention to provide a compact, triaxial SQUID magnetometer which does not produce distortions in the magnetic field being measured.

A SQUID magnetometer in accordance with the present invention has three planar SQUID's which are secured to three nonparallel planar surfaces. Each SQUID has a main coil which is disposed in an external magnetic field. In contrast to a conventional SQUID magnetometer in which the SQUID is shielded by a superconducting shield and flux threading a pickup coil is measured, in the present invention, the flux which threads the main coil of the SQUID itself is measured. Therefore, the SQUID is not housed within a superconducting shield which could produce distortions in the magnetic field, and more accurate measurements can be performed.

As long as the three SQUID's are on nonparallel surfaces, there is no restriction on their relative orientation, but in a preferred embodiment, the three SQUID's are mounted on the outer surfaces of a cube so as to be orthogonal.

The SQUID's may be either dc or rf SQUID's. In a preferred embodiment, the SQUID's are of the dc type.

BRIEF DESCRIPTION OF THE DRAWINGS

In the figures, the same reference numerals indicate the same or corresponding parts.

DESCRIPTION OF THE PREFERRED EMBODIMENTS

Figure 1:
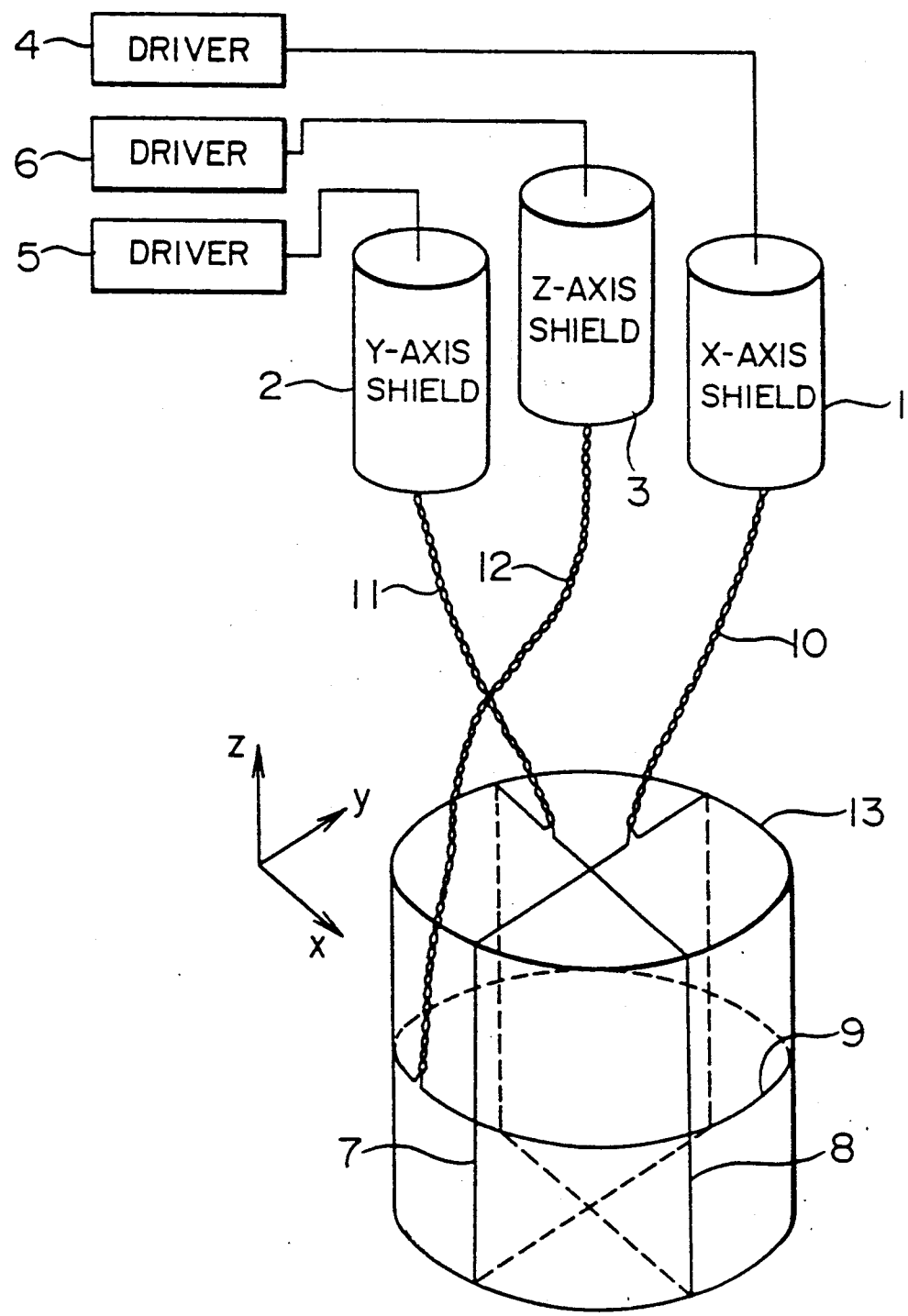
FIG. 1 is a schematic illustration of a conventional SQUID magnetometer.
Figure 2:
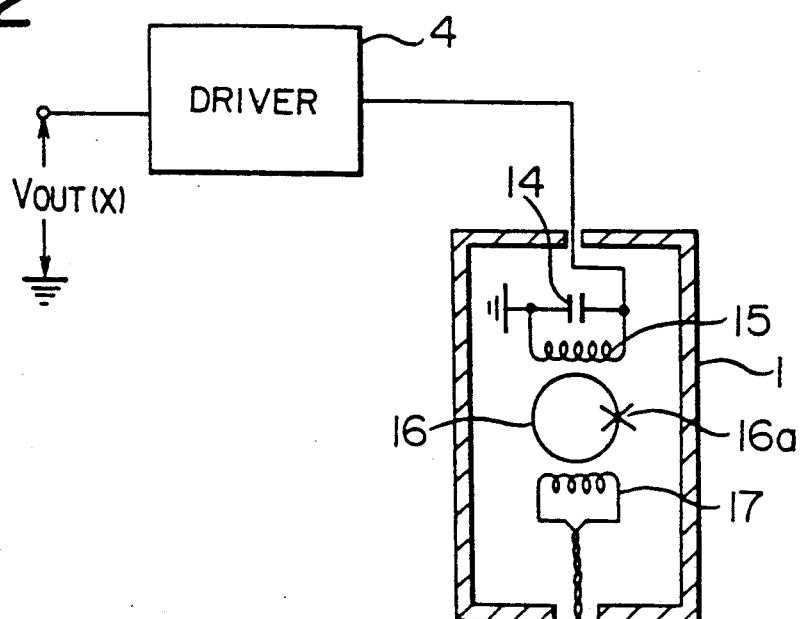
FIG. 2 is a schematic illustration of the inside of the x-axis superconducting shield of the magnetometer of FIG. 1.
Figure 3:
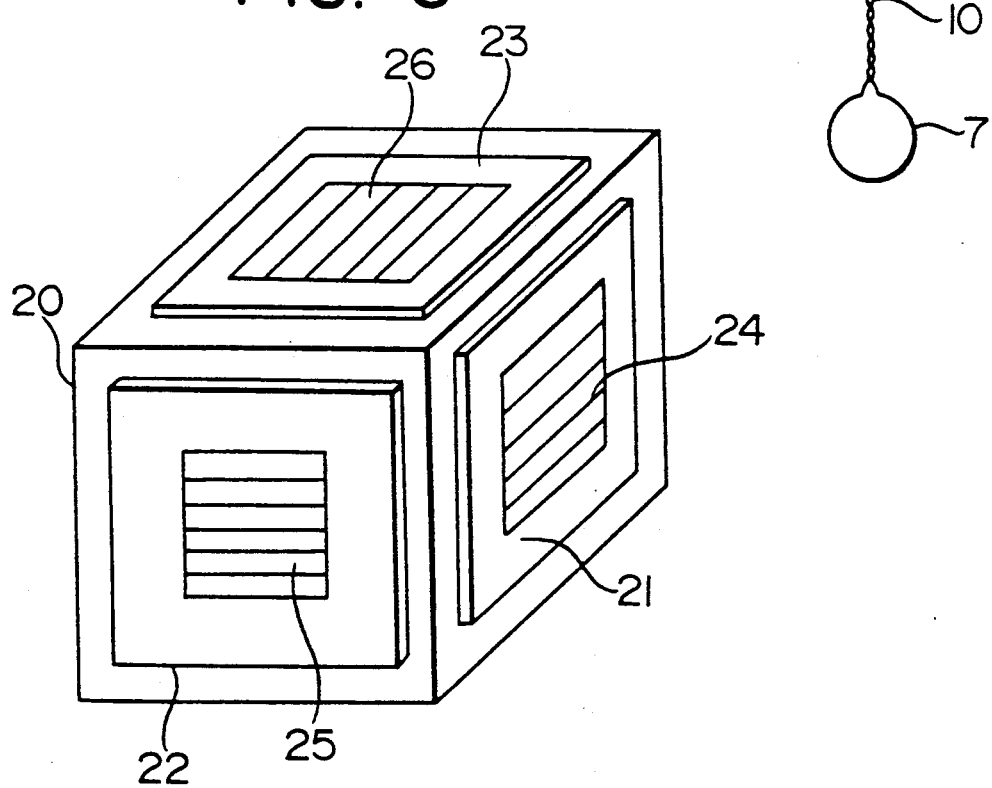
FIG. 3 is a schematic perspective view of a portion of a SQUID magnetometer in accordance with this invention.
Figure 3:
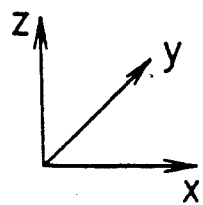

A preferred embodiment of a SQUID magnetometer in accordance with the present invention will now be described while referring to FIGS. 3 through 8 of the accompanying drawings. FIG. 3 is a schematic perspective view of a portion of this embodiment. As shown in this figure, a member shown as a cube 20 has an x-substrate 21, a y-substrate 22, and a z-substrate 23 bonded to three mutually perpendicular surfaces thereof. The three substrates are normal to the x, the y, and the z-axis, respectively, in the figure. The cube 20 is made of a ceramic, fused quartz, or the like, and the substrates are made of Si, $SiO_2$, or other suitable material. The three substrates respectively have an x-axis SQUID 24, a y-axis SQUID 25, and a z-axis SQUID 26 fabricated thereon. All three are planar dc SQUID's.

Figure 4:
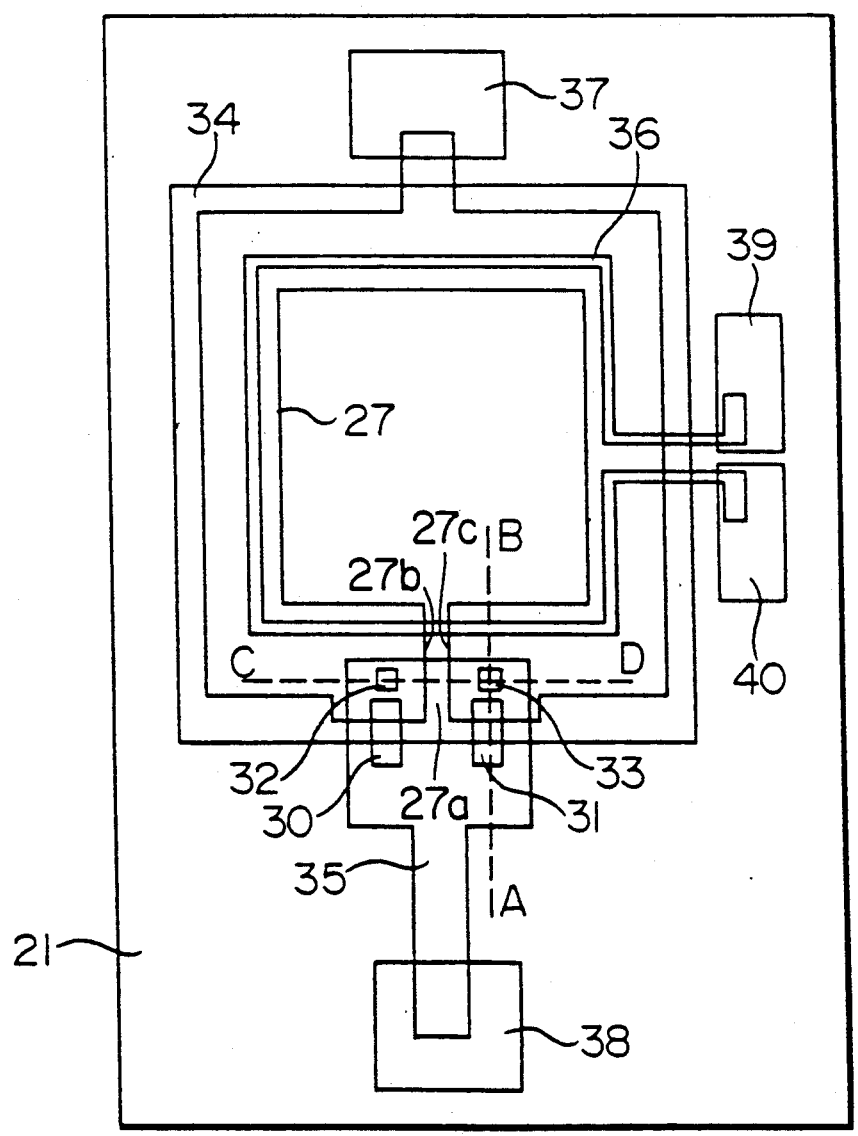
FIG. 4 is a schematic plan view of the x-axis SQUID of the SQUID magnetometer of FIG. 3.
Figure 5:
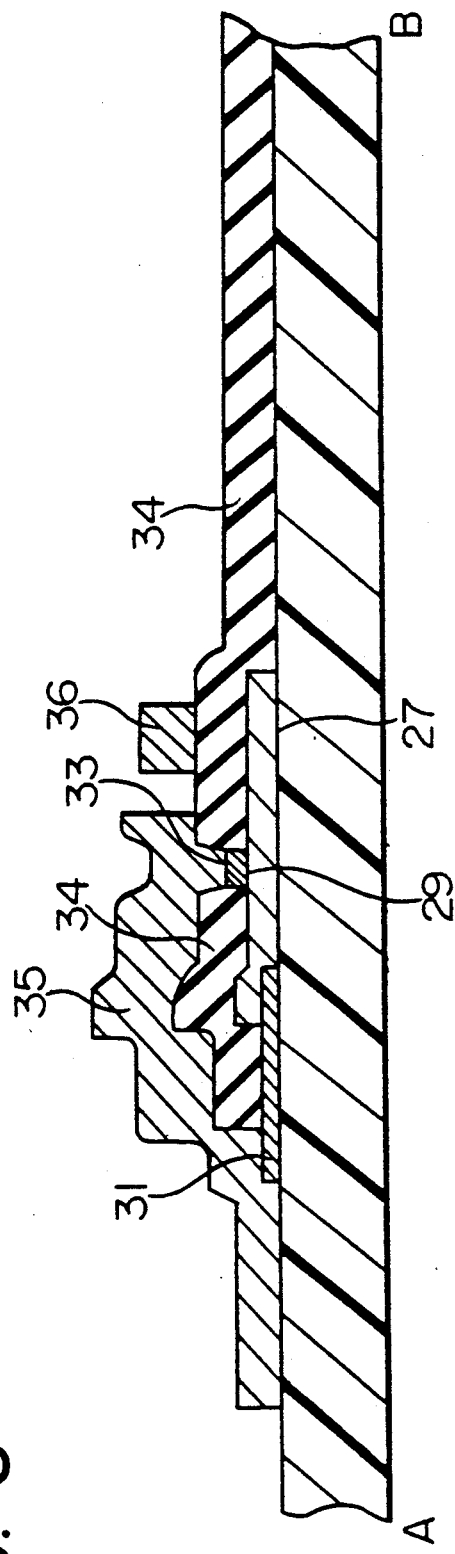
FIG. 5 is a cross-sectional view taken along Line A-B of FIG. 4.
Figure 6:
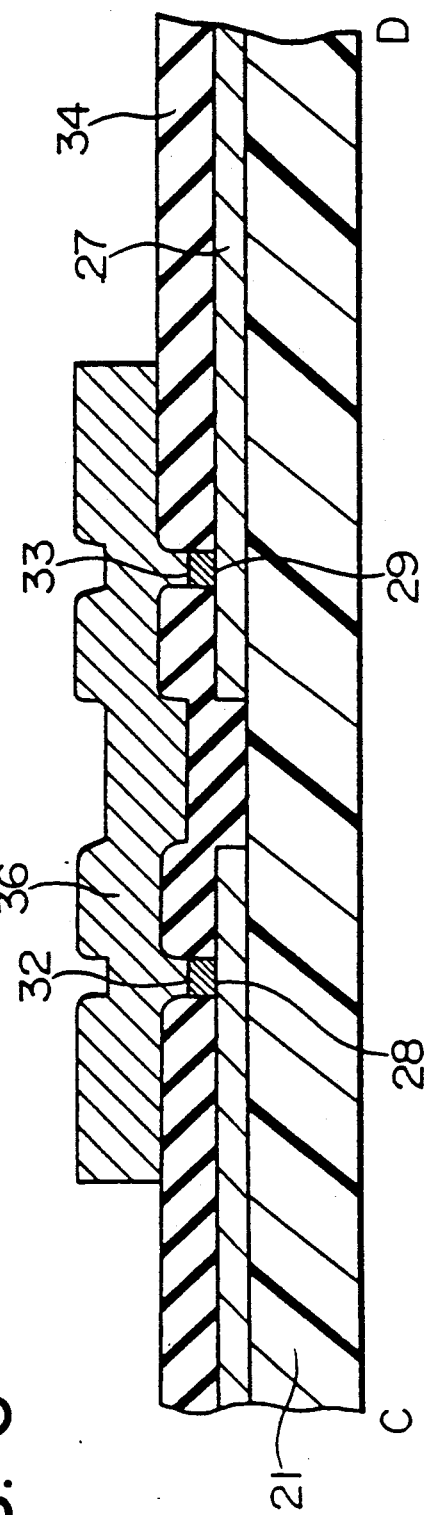
FIG. 6 is a cross-sectional view taken along Line C-D of FIG. 4.

FIG. 4 is a plan view of the x-axis SQUID 24, while FIGS. 5 and 6 are cross sections taken along Line A-B and Line C-D, respectively, of FIG. 4. As shown in these figures, the x-axis substrate 21 has a main coil 27 formed thereon. The coil 27 has an opening 27a. Ends 27b, 27c of the coil 27 are adjacent to the opening 27a. Two Josephson tunnel junctions 28 and 29 are formed atop the ends of the main coil 27, and two upper electrodes 32 and 33 are formed atop the junctions 28 and 29, respectively. Two shunt resistances 30 and 31 are also formed atop the substrate 21 in contact with the ends of the main coil 27. The shunt resistances 30 and 31 are electrically connected to the upper electrodes 32 and 33 by a wiring layer 35. The main coil 27, the Josephson tunnel junctions 28 and 29, the upper electrodes 32 and 33, and the wiring 35 form a superconducting loop. The shunt resistances 30 and 31 are connected in parallel with the Josephson tunnel junctions 28 and 29 between the main coil 27 and the wiring 35. A layer of electrical insulation 34 is formed atop the main coil 27, and an open-ended modulation coil 36 which is magnetically coupled with the main coil 27 is formed atop the electrical insulation 34 above the main coil 27. First through fourth contact pads 37-40 are formed atop the substrate 21. The first contact pad 37 is electrically connected to a portion of the main coil 27, the second contact pad 38 is electrically connected to the wiring 35, and the third and fourth contact pads 39 and 40 are electrically connected to opposite ends of the modulation coil 36.

The main coil 27, the modulation coil 36, the upper electrodes 32 and 33, and the wiring 35 are usually made of a superconductor such as Pb or Nb. The thickness of these members should be at least several times the magnetic field penetration depth of the material which is used (760 Angstroms for Nb). The electrically insulating layer 34 can be made of a material such as SiO, $SiO_2$, or $Nb_2O_5$. The shunt resistances 30 and 31 can be made of a materials such as Mo, Ta, or Au. The Josephson tunnel junctions 28 and 29 are formed of a material such as $Nb_2O_5$ or $Al_2O_3$ and have a thickness of several dozen Angstroms. The y-axis SQUID 25 and the z-axis SQUID 26 have the same structure as that shown in FIGS. 4-7.

Figure 7:
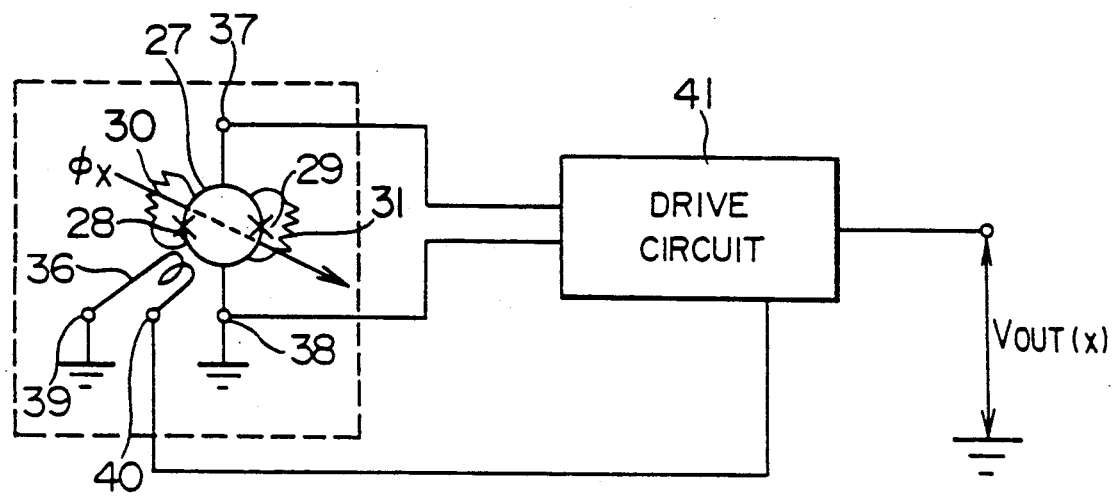
FIG. 7 is a schematic illustration showing the electrical equivalent of the x-axis SQUID of FIG. 4 connected to a drive circuit.

FIG. 7 is a schematic diagram showing the electrical equivalent of the x-axis SQUID 24 of FIG. 4 connected to an x-axis drive circuit 41. The drive circuit 41 is a conventional flux-locked loop (FLL) circuit, numerous examples of which are described elsewhere, such as in Review of Scientific Instruments (Vol. 55, No. 6, June, 1984, pp. 952-957). The other two SQUID's are connected to similar drive circuits.

During the operation of the present invention, the cube 20 and the three SQUID's which are mounted thereon are immersed in liquid helium in a magnetic field to be measured and the SQUID's are cooled to a temperature at which they become superconducting. Each SQUID is driven by an FLL drive circuit.

With respect to FIG. 7, when the flux through the superconducting loop formed by the main coil 27, the Josephson tunnel junctions 28 and 29, the upper electrodes 32 and 33, and the wiring 35 of the x-axis SQUID 24 varies by an amount $\Delta\Phi_x$ from a reference value $\Phi_x$, the output voltage $V_{out(x)}$ of the drive circuit 41 changes by $\Delta V_x$. The change in the flux threading the superconducting loop and the change in the output voltage $V_{out(x)}$ are related to one another by a coefficient $\alpha$ as expressed by the following equation:

$$\Delta\Phi_x = \alpha \cdot \Delta V_x \tag{1}$$

If the area of the superconducting loop for the x-axis SQUID is $S_x$, then the variation $\Delta B_x$ of the x component of the external magnetic field corresponding to $\Delta V_x$ is given by $$\Delta B_x = \Delta\Phi_x / S_x = \alpha \cdot \Delta V_x / S_x \tag{2}$$

The variations $\Delta B_y$ and $\Delta B_z$ of the y component and the z component of the external magnetic field are found in the same manner. Thus, variations in the three orthogonal components of the magnetic field can be detected.

Since the flux being measured by each SQUID is the flux passing through the main coil 27 of the SQUID, a superconducting shield which would distort the external magnetic field is not employed, and the magnetic field can be detected with greater accuracy. Furthermore, as there is no superconducting shield or external pickup coil, a magnetometer in accordance with the present invention is extremely compact.

Figure 8:
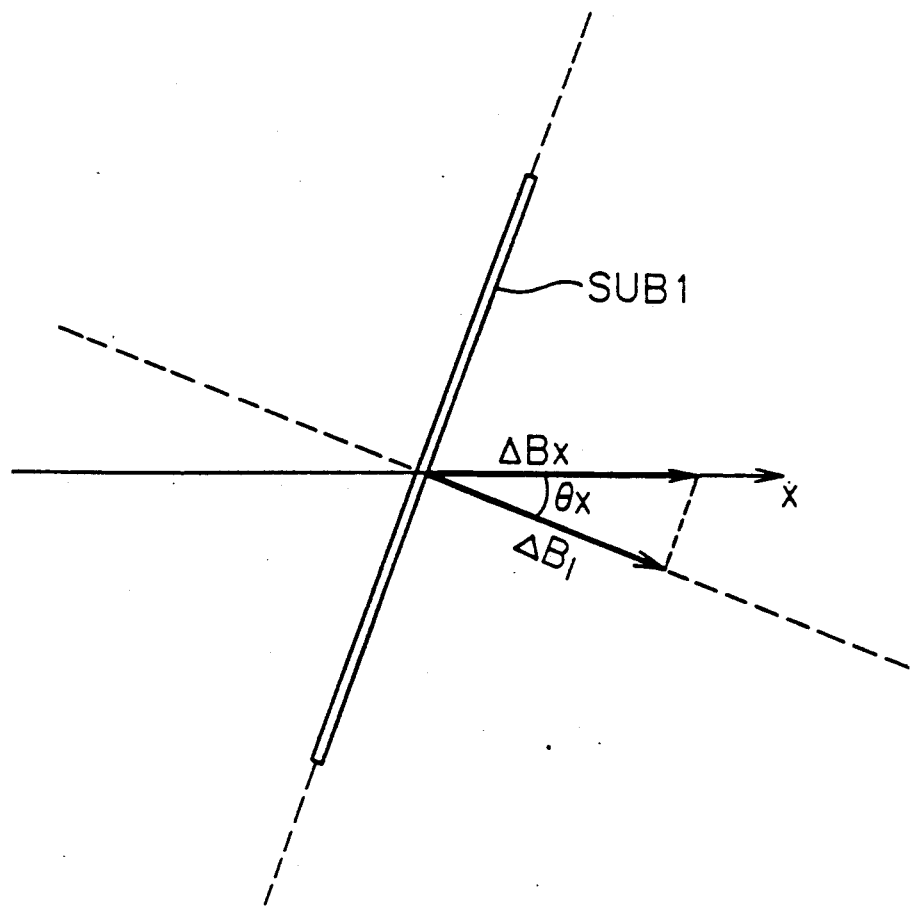
FIG. 8 is a schematic illustration of one substrate of a magnetometer in accordance with the present invention, showing the case in which the three substrates of the magnetometer are not orthogonal.

In the embodiment of FIG. 3, the three SQUID's lie in orthogonal planes, but it is possible to dispose the SQUID's on any three nonparallel planar surfaces. Suppose, for example, that three SQUID's are mounted on three nonparallel substrates, none of which is normal to the x, the y, or the z axis. Each SQUID is sensitive to the component of the magnetic field which is normal to the substrate on which it is mounted. The variations of the magnetic field detected by the three SQUID's are respectively $\Delta B_1$, $\Delta B_2$, and $\Delta B_3$. If, as shown in FIG. 8, the angle between the x axis and the normal to the first substrate SUB1 is $\theta_x$, and the corresponding angles for the other two substrates are respectively $\theta_y$ and $\theta_z$, then the variations $\Delta B_x$, $\Delta B_y$, and $\Delta B_z$ of the external magnetic field along the x, y, and z axes can be determined using the following equations:

$$\Delta B_1 = \Delta B_x \cos \theta_x \tag{3}$$

$$\Delta B_2 = \Delta B_y \cos \theta_y \tag{4}$$

$$\Delta B_3 = \Delta B_x \cos \theta_z \tag{5}$$

Thus, the three SQUID's need not be orthogonal to determine the three orthogonal components of a variation in the magnetic field.

What is claimed is:

1. A SQUID magnetometer comprising:
   a member having three nonparallel planar surfaces, each surface having a substrate disposed thereon; and
   three planar SQUIDs, each of which is formed on one of said three substrates and each of which has a main coil formed on the substrate which is threaded by the flux of a magnetic field being measured.

2. A SQUID magnetometer as claimed in claim 1, wherein said three planar surfaces are orthogonal.

3. A SQUID magnetometer as claimed in claim 1 wherein each
   main coil has an opening and two open ends adjacent to the opening and wherein each of the SQUIDs further includes:
   two Josephson tunnel junctions, each of which is formed atop one of the open ends of said main coil;
   two upper electrodes, each of which is formed atop one of said Josephson tunnel junctions;
   two shunt resistances which are connected in parallel with said two Josephson tunnel junctions;
   wiring which connects said two electrodes and said two shunt resistances and forms a superconducting loop;
   a modulation coil which is magnetically coupled with said main coil; and
   an electrically insulating layer which is formed between said main coil and said modulation coil and between said main coil and said wiring.

4. A SQUID magnetometer as claimed in claim 1 wherein the member is made of one of the group consisting of ceramic material and fused quartz.

5. A SQUID magnetometer as claimed in claim 1 wherein the substrates are made of one of the group consisting of Si and $SiO_2$.

* * * * *